US012622257B2

(12) United States Patent
Lanzillo et al.

(10) Patent No.: US 12,622,257 B2
(45) Date of Patent: May 5, 2026

(54) BACKSIDE LOCAL INTERCONNECT

(71) Applicant: INTERNATIONAL BUSINESS MACHINES CORPORATION, Armonk, NY (US)

(72) Inventors: Nicholas Anthony Lanzillo, Wynantskill, NY (US); Lawrence A. Clevenger, Saratoga Springs, NY (US); Ruilong Xie, Niskayuna, NY (US); Reinaldo Vega, Mahopac, NY (US); Albert M. Chu, Nashua, NH (US); Brent A. Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 386 days.

(21) Appl. No.: 18/349,999

(22) Filed: Jul. 11, 2023

(65) Prior Publication Data

US 2025/0022795 A1     Jan. 16, 2025

(51) Int. Cl.
| | |
|---|---|
| *H10W 20/42* | (2026.01) |
| *H10W 20/00* | (2026.01) |
| *H10W 20/41* | (2026.01) |

(52) U.S. Cl.
CPC ......... *H10W 20/42* (2026.01); *H10W 20/069* (2026.01); *H10W 20/089* (2026.01); *H10W 20/427* (2026.01); *H10W 20/435* (2026.01)

(58) Field of Classification Search
CPC ............. H01L 23/5226; H01L 23/5283; H01L 23/5286; H01L 21/76816; H01L 21/76897; H10W 20/42; H10W 20/069; H10W 20/427; H10W 20/089; H10W 20/435

USPC ......................................................... 257/621
See application file for complete search history.

(56) References Cited

U.S. PATENT DOCUMENTS

| | | | |
|---|---|---|---|
| 10,636,739 | B2 | 4/2020 | Beyne |
| 10,734,412 | B2 | 8/2020 | Glass |
| 11,081,559 | B1 | 8/2021 | Liang |
| 11,342,261 | B2 | 5/2022 | Cosemans |
| 11,437,283 | B2 | 9/2022 | Lilak |
| 2021/0013150 | A1 | 1/2021 | Rashed |
| 2022/0102380 | A1 | 3/2022 | Chanemougame |
| 2022/0367658 | A1 | 11/2022 | Yim |
| 2023/0378190 | A1* | 11/2023 | Liaw ................... H10D 84/038 |

* cited by examiner

*Primary Examiner* — Tu-Tu V Ho
(74) *Attorney, Agent, or Firm* — Yuanmin Cai

(57) ABSTRACT

Embodiments of present invention provide a semiconductor structure. The semiconductor structure includes a device layer having a frontside and a backside and including a transistor that includes a source/drain region at the backside of the device layer; a first and a second backside metal line with the source/drain region at least partially overlapping vertically with the first backside metal line and not overlapping vertically with the second backside metal line; and a backside local interconnect that conductively connects the source/drain region of the transistor with the second backside metal line, where the backside local interconnect includes a first portion and a second portion, the first portion horizontally extending from an area underneath the source/drain region to an area outside the source/drain region of the transistor, the second portion vertically connecting the first portion to the second backside metal line. Methods for forming the same are also provided.

19 Claims, 12 Drawing Sheets

300

200

514        513

100

512        511

611

522        600{        521

621

500

533        532        531

50

300

200

100

511

611

600

622

621

500

533

532

531

60

300

200

100

511

611

622

621

600

500

533

532

531

710
711
724     735

710
711
725     735

710
711
726     736

710
711
726     742     741     736

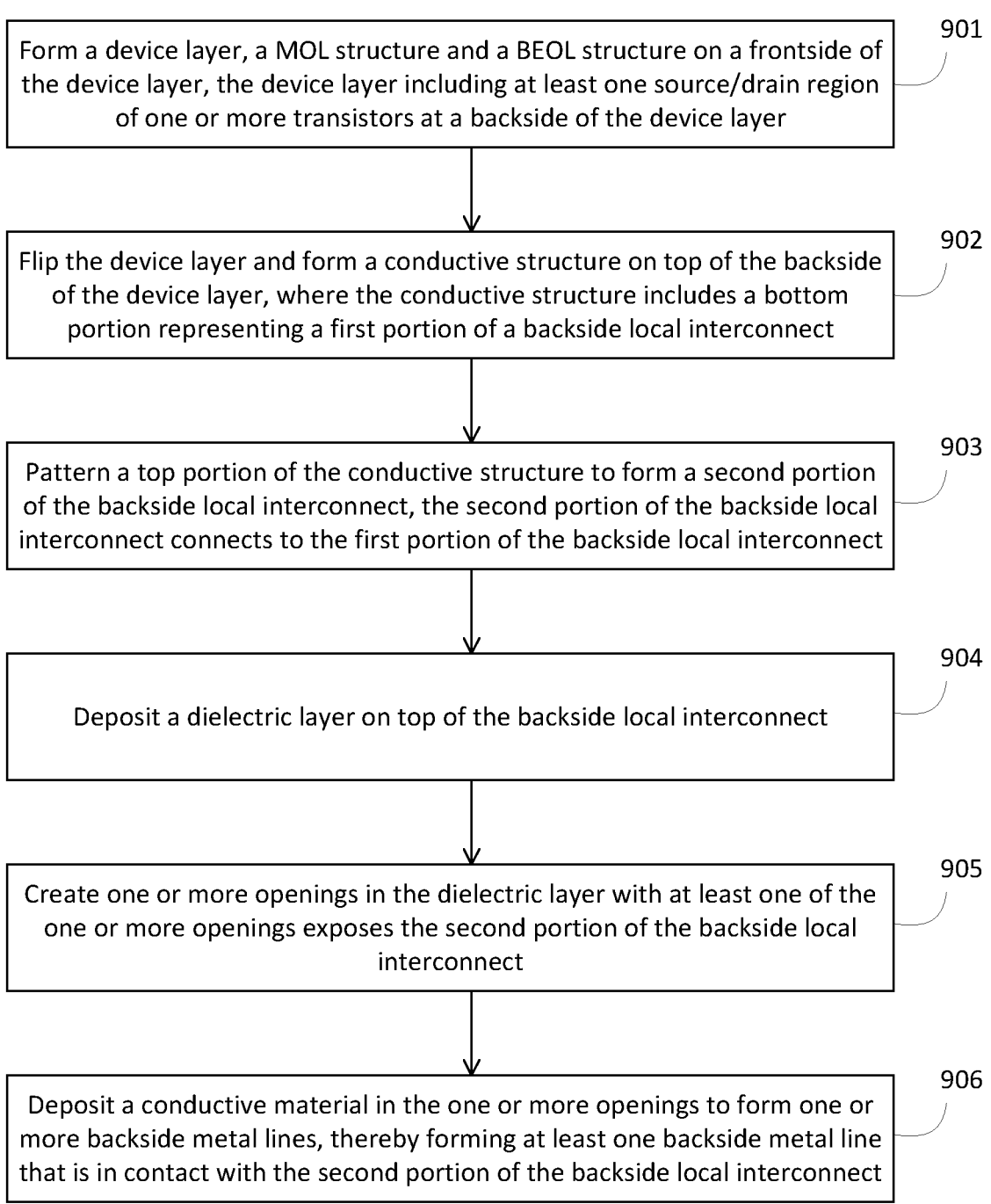

901

Form a device layer, a MOL structure and a BEOL structure on a frontside of the device layer, the device layer including at least one source/drain region of one or more transistors at a backside of the device layer

902

Flip the device layer and form a conductive structure on top of the backside of the device layer, where the conductive structure includes a bottom portion representing a first portion of a backside local interconnect

903

Pattern a top portion of the conductive structure to form a second portion of the backside local interconnect, the second portion of the backside local interconnect connects to the first portion of the backside local interconnect

904

Deposit a dielectric layer on top of the backside local interconnect

905

Create one or more openings in the dielectric layer with at least one of the one or more openings exposes the second portion of the backside local interconnect

906

Deposit a conductive material in the one or more openings to form one or more backside metal lines, thereby forming at least one backside metal line that is in contact with the second portion of the backside local interconnect

FIG. 12

BACKSIDE LOCAL INTERCONNECT

BACKGROUND

The present application relates to manufacturing of semiconductor integrated circuits. More particularly, it relates to backside local interconnect for semiconductor chips.

Semiconductor chips contain millions or even billions of transistors that are interconnected and electrically powered to achieve certain device functionality. Current chip manufacturing technology generally employs wiring made at the frontside of the chip for both power and signal distribution. As a result, the power wiring and signal wiring, in addition to other wirings such as those for input/output and clock, compete for a limited real estate of wiring area. The ability to rout wiring efficiently is quickly becoming a serious challenge for the development of next node technology where the limited real estate of wiring area is becoming even scarcer.

As a new technology platform, there is a developing trend of moving the entire power delivery or distribution network to the backside of the chip, leaving the limited real estate of frontside of the chip mainly for signal routing and/or distribution. This not only increases power delivery efficiency at the backside but also signal routing resources at the frontside of the chip.

At the backside of the chip, source/drain regions of active transistors are usually connected directly to backside metal lines of, for example, a backside metal level such as a backside metal level-1 through one or more direct backside contacts. Moreover, a source/drain region of an active transistor is usually connected to one of the backside metal lines directly underneath thereof, where the backside metal lines have a pitch that is normally at a same order of magnitude as a size or width of the source/drain region of the active transistor.

SUMMARY

Embodiments of present invention provide a semiconductor structure. The semiconductor structure includes a device layer having a frontside and a backside, the device layer including a transistor, the transistor including a source/drain region at the backside of the device layer; a first and a second backside metal line of a backside metal level, the source/drain region of the transistor at least partially overlapping vertically with the first backside metal line and not overlapping vertically with the second backside metal line; and a backside local interconnect, the backside local interconnect conductively connecting the source/drain region of the transistor with the second backside metal line, wherein the backside local interconnect includes a first portion and a second portion, the first portion horizontally extending from an area underneath the source/drain region of the transistor to an area outside the source/drain region of the transistor, the second portion vertically connecting the first portion to the second backside metal line. Since the second backside metal line does not vertically overlap with, and thus is not directly underneath the source/drain region of the transistor, the backside local interconnect enables the connection between the source/drain region of the transistor and the second backside metal line. In one aspect, the source/drain region of the transistor conductively connects to the first backside metal line through a direct backside contact. By connecting to the source/drain region of the transistor through both a backside local interconnect and a direct backside contact, embodiments of present invention provide the flexibility of providing signal routing and power distribution through a same transistor.

In one embodiment, the transistor is a first transistor, the semiconductor structure further includes a second transistor, the second transistor having a source/drain region at the backside of the device layer, where the first portion of the backside local interconnect conductively connects the source/drain region of the second transistor with the source/drain region of the first transistor. In one aspect, the second backside metal line is located vertically between the first transistor and the second transistor.

In another embodiment, the semiconductor structure further includes a third backside metal line of the backside metal level, the third backside metal line being next to the second backside metal line, where the backside local interconnect further includes a third portion, the third portion conductively connecting the first portion of the backside local interconnect with the third backside metal line.

In yet another embodiment, the semiconductor structure further includes a third backside metal line of the backside metal level, the third backside metal line being next to the first backside metal line, where the backside local interconnect further includes a third portion, the third portion conductively connecting the first portion of the backside local interconnect with the third backside metal line.

In one embodiment, the first portion of the backside local interconnect is conductively connected to the source/drain region of the transistor through a conductive via but does not directly contact the source/drain region of the transistor.

In another embodiment, a first cross-section of the first portion of the backside local interconnect has a first trapezoidal shape with a top base that is narrow than a bottom base, and a second cross-section of the second portion of the backside local interconnect has a second trapezoidal shape with a top base that is wide than a bottom base, wherein the first and the second cross-section being taken in a direction orthogonal to the first and the second backside metal line.

In yet another embodiment, the source/drain region of the transistor has a width and the backside metal level has a pitch, wherein the width is smaller than the pitch.

Embodiments of present invention further provide a method of forming a semiconductor structure. The method includes forming a device layer on top of a substrate, the device layer having a frontside and a backside and including at least one transistor, the at least one transistor including a source/drain region at the backside of the device layer; forming a backside local interconnect, the backside local interconnect having a first portion and a second portion, the first portion being conductively connected to the source/drain region of the at least one transistor; and form one or more backside metal lines, one of the one or more backside metal lines being in contact with the second portion of the backside local interconnect.

In one embodiment, forming the backside local interconnect includes flipping the substrate upside-down; exposing the backside of the device layer; forming a conductive structure on top of the backside of the device layer, wherein the conductive structure includes the first portion of the backside local interconnect and a raw portion on top of the first portion; and etching the raw portion of the conductive structure to form the second portion of the backside local interconnect.

According to one embodiment, forming the conductive structure includes depositing a dielectric layer on top of the backside of the device layer; creating an opening in the dielectric layer, the opening exposing at least a portion of the source/drain region and an area next to the exposed portion of the source/drain region of the at least one transistor; and filling the opening with a conductive material to form the conductive structure.

According to another embodiment, forming the conductive layer includes depositing a layer of conductive material on top of the backside of the device layer; and etching the layer of conductive material to form the conductive structure in a subtractive patterning process.

BRIEF DESCRIPTION OF THE DRAWINGS

The present invention will be understood and appreciated more fully from the following detailed description of embodiments of present invention, taken in conjunction with accompanying drawings of which:

FIG. 12 is a demonstrative illustration of a flow-chart of a method of manufacturing a semiconductor structure according to embodiments of present invention.

Figure 1:
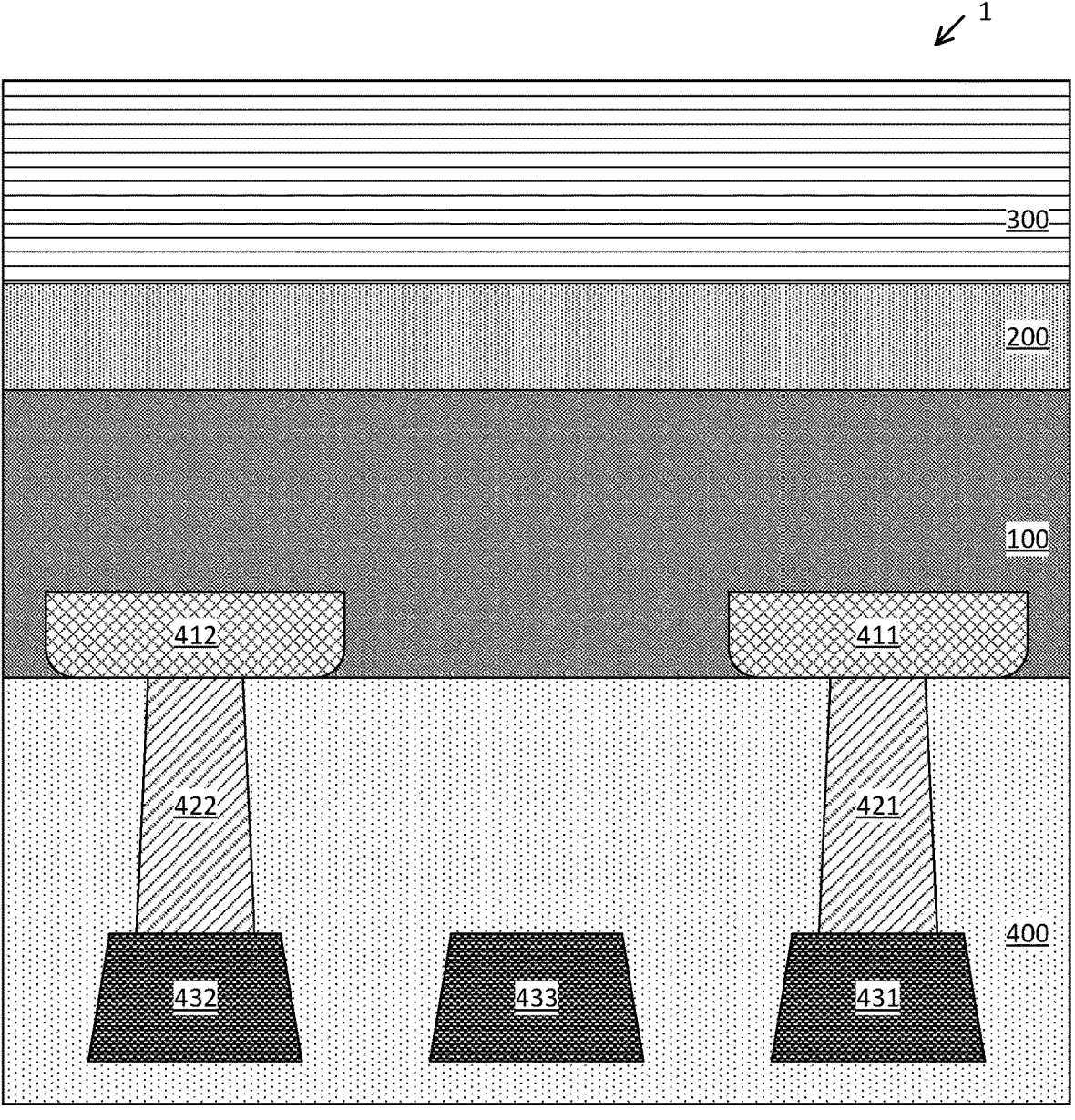
FIG. 1 is a demonstrative illustration of cross-sectional view of a semiconductor structure as is known in the art.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIG. 1 is a demonstrative illustration of cross-sectional view of a semiconductor structure as is known in the art. The semiconductor structure 1 generally includes a device layer 100 with a middle-of-line (MOL) structure 200 and a back-end-of-line (BEOL) structure 300 formed on a frontside of the device layer 100. The device layer 100 may include one or more transistors with source/drain regions 411 and 412 that are exposed at a backside of the device layer 100. The source/drain regions 411 and 412 are usually connected directly to one or more backside metal lines (BMLs) of a backside metal level such as a backside metal level-1 (BM1). For example, the BM1 may include BML 431, 432, and 433, some of which may be connected to the source/drain regions 411 and 412 through one or more direct backside contacts (DBCs) such as, for example, DBC 421 and 422.

In the currently art, a source/drain region of a transistor is usually connected to a backside metal line directly underneath the source/drain region. For example, the source/drain region 411 is connected to the BML 431 directly underneath the source/drain region 411. Moreover, BMLs 431, 432, and 433 of the BM1 usually has a pitch that is close to, or at the same order of magnitude as, a cell height of the semiconductor structure. In the meantime, the width of the source/drain region 411 typically does not extend to the full cell height. For example, the source/drain region 411 of the transistor may have a width or horizontal size that is about the same as, or less than, a distance between BML 431 and BML 432 that are next to each other. Therefore, only BML 431 may be directly underneath the source/drain region 411. As an example, for technology node of 35 nm or less, the cell height of the semiconductor structure is typically around 100 nm.

Figure 2:
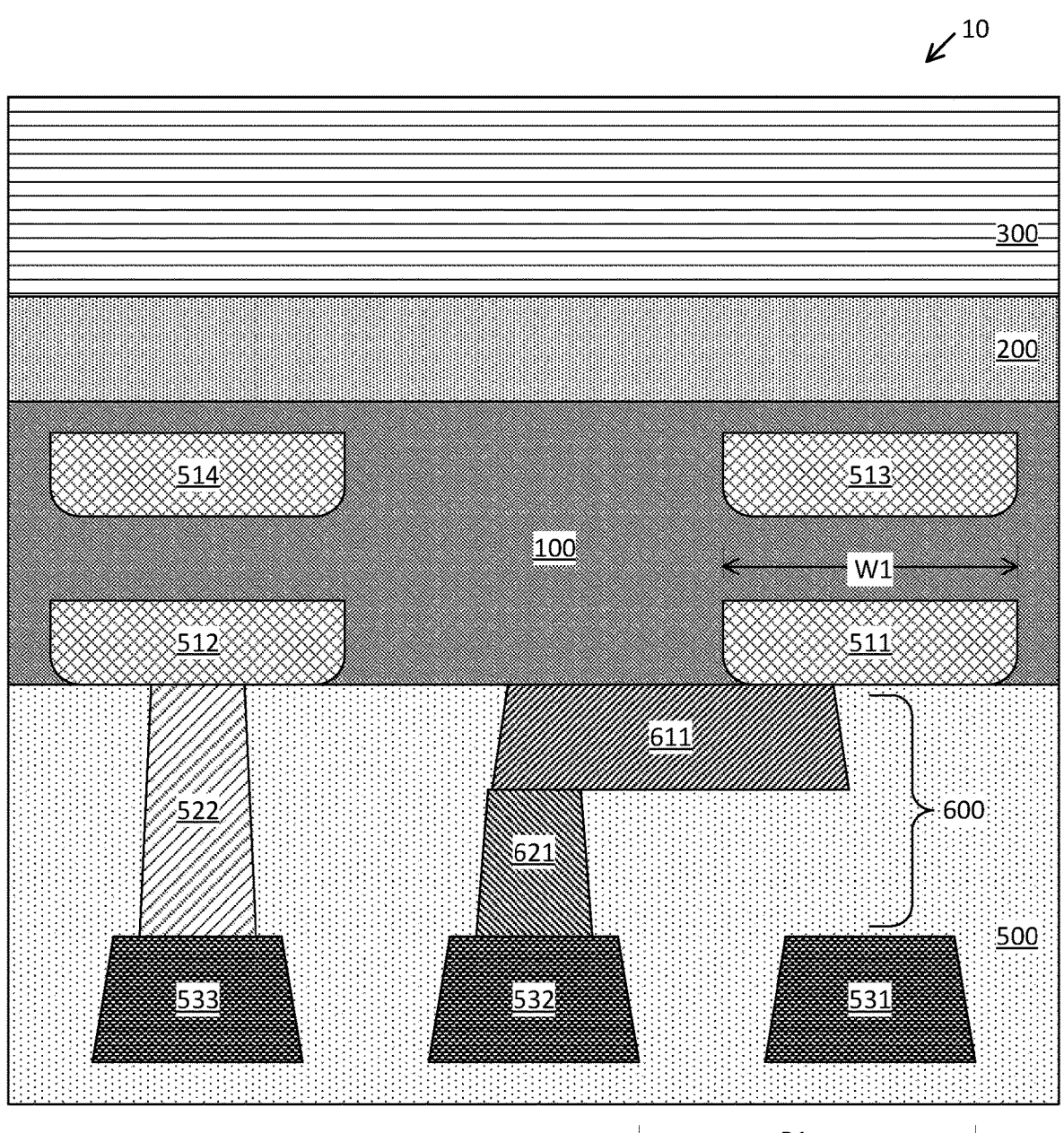
FIGS. 2-8 are demonstrative illustrations of cross-sectional views of semiconductor structures according to various embodiments of present invention.

FIG. 2 is a demonstrative illustration of cross-sectional view of a semiconductor structure according to one embodiment of present invention. More particularly, embodiments of present invention provide a semiconductor structure 10 that includes a device layer 100 with a MOL structure 200 and a BEOL structure 300 formed on a frontside of the device layer 100. The device layer 100 may also include a first transistor with a first source/drain region 511, a second transistor with a second source/drain region 512, a third transistor with a third source/drain region 513, and a fourth transistor with a fourth source/drain region 514. In one embodiment, the first transistor and the third transistor may be stacked vertically with the third source/drain region 513 on top of, albeit not directly, the first source/drain region 511. The second transistor and the fourth transistor may be stacked vertically with the fourth source/drain region 514 on top of, albeit not directly, the second source/drain region 512.

According to one embodiment, the semiconductor structure 10 includes a backside local interconnect (BLI), instead of a direct backside contact (DBC), that connects a source/drain region of a transistor to a backside metal line (BML) that may not be directly underneath the source/drain region. For example, embodiments of present invention provide a BLI 600 that includes a first portion 611 and a second portion 621 that are respectively a horizontal portion and a vertical portion of the BLI 600. The first portion 611 of the BLI 600 horizontally extends from an area underneath the first source/drain region 511 to an area outside the first source/drain region 511. The second portion 621 of the BLI 600 vertically connects the first portion 611 of the BLI 600 to a second BML 532. The semiconductor structure 10 further includes a first BML 531 and a third BML 533. The first BML 531 may vertically overlap, or at least partially overlap, with the first source/drain region 511. On the other hand, the second BML 532 does not vertically overlap with the first source/drain region 511. The second BML 532 is located vertically between the first source/drain region 511 and the second source/drain region 512. Since the second BML 532 does not vertically overlap with the first source/drain region 511, a conventional DBC may not be able to connect the first source/drain region 511 with the second BML 532. Embodiments of present invention enable such connection by applying the BLI 600. In the meantime, the third BML 533 vertically overlaps with the second source/drain region 512 and thus is conductively connected to the second source/drain region 512 through a DBC 522. The BLI 600, the DBC 522, and the first, second, and third BMLs 531, 532, and 533 may be embedded in a dielectric layer 500.

In one embodiment, the first portion 611 of the BLI 600 may be a straight conductive bar, placed in a direction orthogonal to the BML 531, 532, and 533. The first portion 611 may be in direct contact with the first source/drain region 511. In another embodiment, the first portion 611 may be in contact with other source/drain region or regions of other transistors and may be in contact with source/drain region or regions of transistors not directly but through a conductive via, as being described below in more details.

In another embodiment, the first source/drain region 511 of the first transistor has a width W1, and the metal level of BML 531, 532, and 533 may have a pitch P1, and the width W1 of the first source/drain region 511 is equal to or smaller than the pitch P1. In other words, BML 531, 532, and 533 generally has a pitch P1 that is generally at the same order of magnitude as the size or width W1 of the first source/drain region 511 of the transistor.

Figure 3:

FIG. 3 is a demonstrative illustration of cross-sectional view of a semiconductor structure according to one embodiment of present invention. More particularly, embodiments of present invention provide a semiconductor structure 20 that is, to certain extent, similar to the semiconductor structure 10 illustrated in FIG. 2. Moreover, in addition to being connected to the second BML 532 through the BLI 600, the first transistor in the semiconductor structure 20 may further include a DBC 521. The DBC 521 connects the first source/drain region 511 with the first BML 531 directly underneath the first source/drain region 511. In other words, according to embodiments of present invention, a source/drain region of a transistor may be connected to two separate BMLs through the use of one DBC and one BLI. This may be used in providing both power distribution and signal routing to a single transistor, which adds further flexibility in the use of backside real estate of a semiconductor chip. For example, the connection between the first source/drain region 511 and the second BML 532 via the BLI 600 may be used in signal routing and the connection between the first source/drain region 511 and the first BML 531 via the DBC 521 may be used for power distribution.

Figure 4:
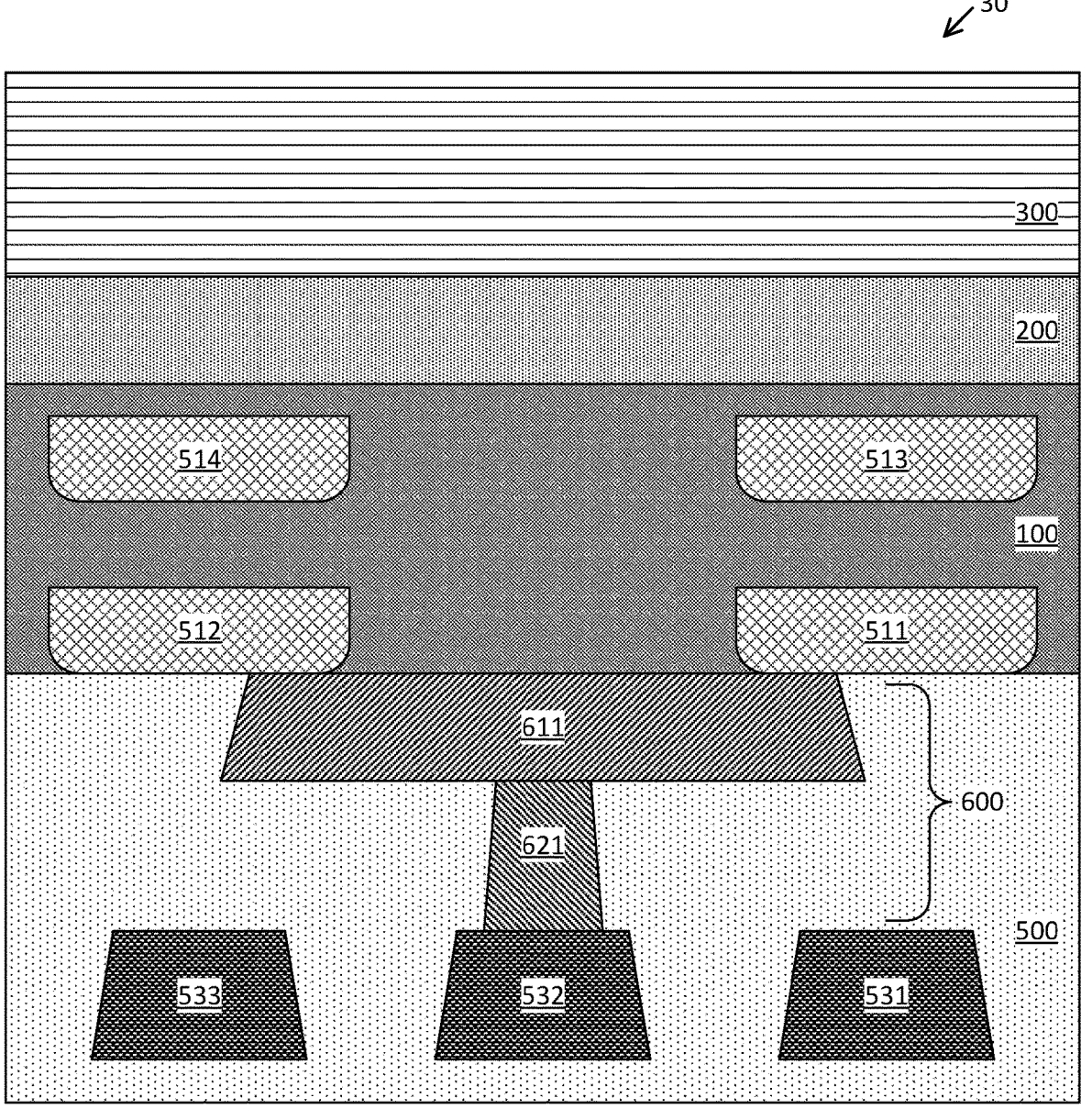

FIG. 4 is a demonstrative illustration of cross-sectional view of a semiconductor structure according to one embodiment of present invention. More particularly, embodiments of present invention provide a semiconductor structure 30 that is, to certain extent, similar to the semiconductor structure 10 illustrated in FIG. 2. Moreover, in addition to being in contact with the first source/drain region 511, the first portion 611 of the BLI 600 may further extend to be in contact with the second source/drain region 512 of the second transistor in the device layer 100. In other words, a BLI may include a horizontal portion that conductively connects source/drain regions of two neighboring transistors, and the horizontal portion may then be conductively connected, through a vertical portion of the BLI, to a BML that may not be vertically underneath or overlap with any of the two transistors. In the embodiment illustrated in FIG. 4, the first and second source/drain regions 511 and 512 of the first and second transistors may be conductively connected by the first portion 611, that is a horizontal portion, of the BLI 600. The first portion 611 of the BLI 600 is then conductively connected to the second BML 532 via the second portion 621, that is a vertical portion, of the BLI 600.

Figure 5:

FIG. 5 is a demonstrative illustration of cross-sectional view of a semiconductor structure according to one embodiment of present invention. More particularly, embodiments of present invention provide a semiconductor structure 40 that is, to certain extent, similar to the semiconductor structure 30 illustrated in FIG. 4. Moreover, the BLI 600 include a third portion 622, which is a vertical portion, that connects the first portion 611 of the BLI 600 to the third BML 533. In other words, by the use of two vertical portions, that is, the second portion 621 and the third portion 622, the BLI 600 connects the first source/drain region 511 of the first transistor to both the second BML 532 and the third BML 533, both of which do not vertically overlap with the first source/drain region 511. The BLI 600 also connects the second source/drain region 512 of the second transistor to both the second BML 532 and the third BML 533, one of which vertically overlaps with the second source/drain region 512. In other words, instead of using a DBC such as the DBC 522 in FIG. 3, the second source/drain region 512 may be conductively connected to the third BML 533 through the BLI 600 as well.

Figure 6:

FIG. 6 is a demonstrative illustration of cross-sectional view of a semiconductor structure according to one embodiment of present invention. More particularly, embodiments of present invention provide a semiconductor structure 50 that includes a device layer 100 with a MOL structure 200 and a BEOL structure 300 formed on a frontside of the device layer 100. The device layer 100 also includes at least one source/drain region such as a source/drain region 511 of a transistor, with the source/drain region 511 being at the backside of the device layer 100.

According to one embodiment, the semiconductor structure 50 includes a BLI 600 that connects the source/drain region 511 with a first and a third BML 531 and 533 in a dielectric layer 500. Additionally, the semiconductor structure 50 may include a second BML 532 that may be underneath the source/drain region 511. In other words, the second BML 532 may vertically overlap with the source/drain region 511 but the source/drain region 511 does not overlap with either the first BML 531 or the third BML 533, which are at the left and the right side of the second BML 532.

By applying a first portion 611 of the BLI 600, which not only contacts but also extends to the left side and the right side of the source/drain region 511, embodiments of present invention enables the connection of the source/drain region 511 to the first BML 531 and the third BML 533 that are not vertically underneath the source/drain region 511 and thus the conventional DBC alone will not be able to connect the source/drain region 511 to the first and the third BML 531 and 533 that are adjacent to the second BML 532.

According to one embodiment, the first portion 611 of the BLI 600 illustrated in FIG. 6 is a straight conductive bar, placed in a direction orthogonal to the first, second, and third BMLs 531, 532, and 533. The two ends of the first portion 611 are conductively connected to the first and the third BML 531 and 533 through two vertical portions, that is, second portion 621 and the third portion 622 of the BLI 600.

As being described below in more details in connection with FIGS. 11A-11D, the BLI 600 illustrated in FIG. 6 may be formed through, for example, a damascene etching and deposition process. However, embodiments of present invention are not limited in this aspect and the BLI 600 may be formed through other integration processes such as, for example, a subtractive patterning process or a combination of the subtractive patterning process and the damascene etching and deposition process.

As is illustrated in FIG. 6, the BLI 600 formed by using the damascene etching and deposition process may have a first portion 611 that is generally, cross-section-wise, in a trapezoidal shape with a narrow top base and a wide bottom base. The second portion 621 and the third portion 622 of the BLI 600 may be generally in a trapezoidal shape as well, cross-section-wise, and similarly with a narrow top base and a wide bottom base.

Figure 7:
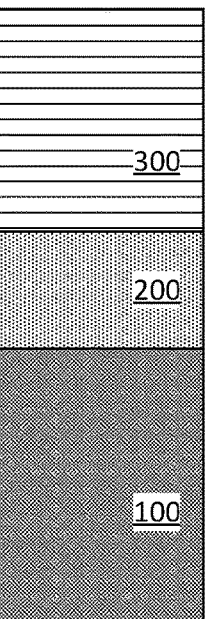

FIG. 7 is a demonstrative illustration of cross-sectional view of a semiconductor structure according to one embodiment of present invention. More particularly, embodiments of present invention provide a semiconductor structure 60 that is structurally similar to the semiconductor structure 50 illustrated in FIG. 6. However, the semiconductor structure 60 may be formed in a process different from the process used in forming the semiconductor structure 50. For example, the semiconductor structure 60 may be formed in a combination of a damascene etching and deposition process and a subtractive patterning process, as is described below in more details with reference to FIGS. 9A-9D. Therefore, some portions of the BLI 600, as illustrated in FIG. 7, formed by this combination of processes may have shapes that are different from portions of the BLI 600, as illustrated in FIG. 6, formed by, for example, a damascene etching and deposition process. Specifically, the second portion 621 and the third portion 622 of the BLI 600 illustrated in FIG. 7 may have a trapezoidal shape that has a wide top base and a narrow bottom base, versus a narrow top base and a wide bottom base of those corresponding portions illustrated in FIG. 6. Moreover, the second portion 621 and the third portion 622 of the BLI 600 illustrated in FIG. 7 may be self-aligned to the first portion 611 by the nature of the subtractive patterning process.

Figure 8:
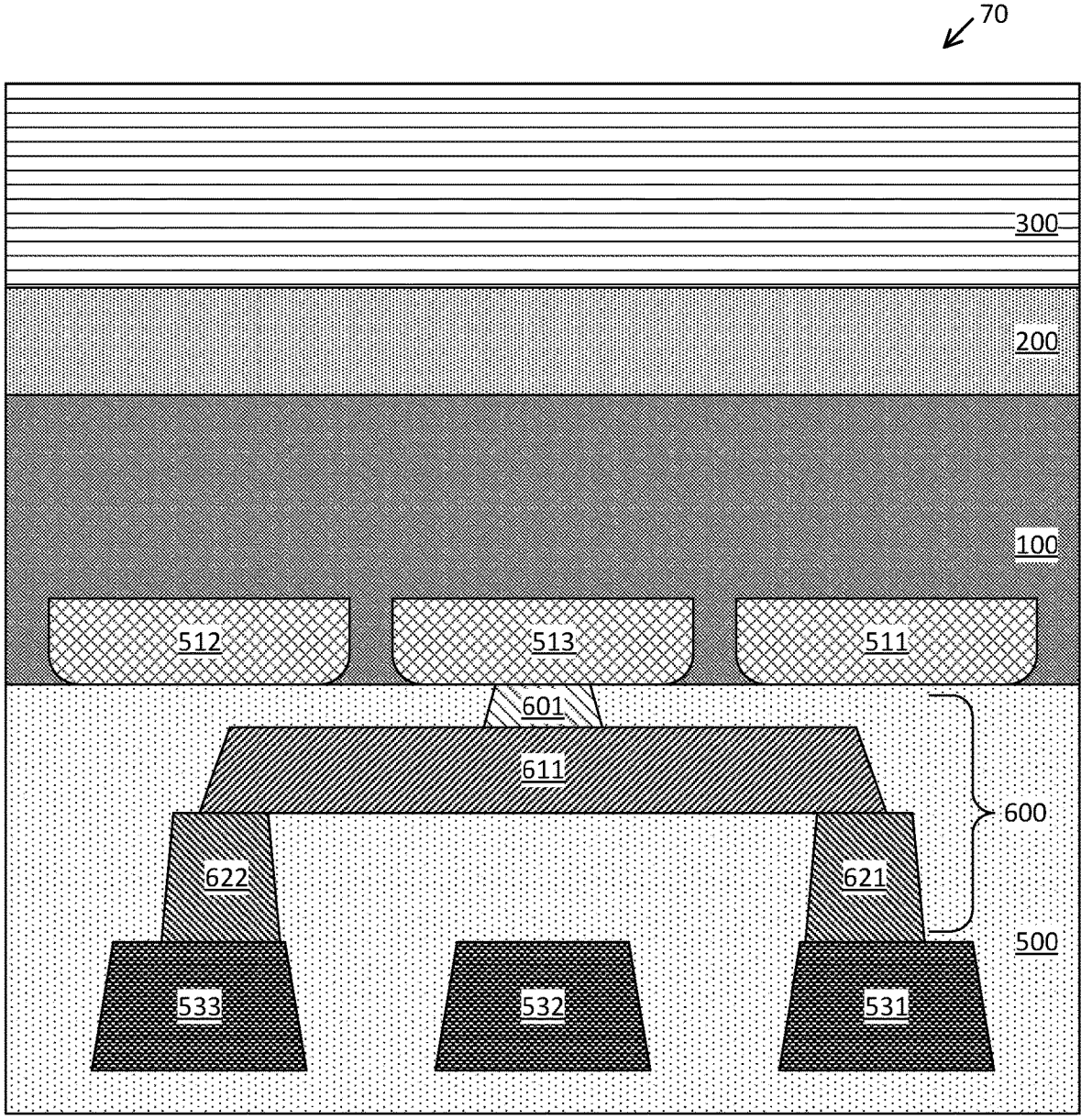

FIG. 8 is a demonstrative illustration of cross-sectional view of a semiconductor structure according to one embodiment of present invention. More particularly, embodiments of present invention provide a semiconductor structure 70 that is, to certain extent, structurally similar to the semiconductor structure 50 illustrated in FIG. 6. However, unlike the BLI 600 in the semiconductor structure 50, the BLI 600 in the semiconductor structure 70 may include a conductive via 601 that connects the first portion 611 of the BLI 600 with a source/drain region of one of the transistors in the device layer 100. For example, as is illustrated in FIG. 8, the conductive via 601 connects the rest of the BLI 600, including the first, second, and third portions 611, 621, and 622 with a third source/drain region 513 in the device layer 100.

FIGS. 9A-9D are demonstrative illustrations of cross-sectional views of a semiconductor structure at various steps of manufacturing thereof according to one embodiment of present invention. More particularly, embodiments of present invention provide a method that uses a combination of a damascene etching and deposition process and a subtractive patterning process in forming a backside local interconnect. It is to be noted here that the drawings in FIGS. 9A-9D (and similarly in FIGS. 10A-10D and FIGS. 11A-11D) are illustrated upside-down, when being compared with those of FIGS. 1-8, to reflect a process that, after forming the MOL structure and BEOL structure (both of which are not shown here for simplicity) at the frontside of a device layer 710, the device layer 710 or semiconductor chip under manufacturing is flipped upside-down for continued processing from the backside of the device layer 710.

Figure 9A:
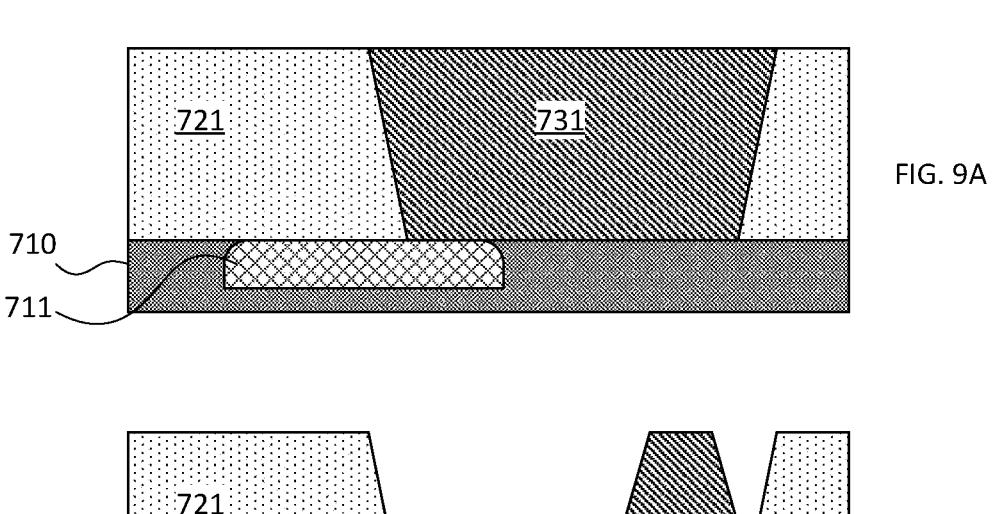
FIGS. 9A-9D are demonstrative illustrations of cross-sectional views of a semiconductor structure at various steps of manufacturing thereof according to one embodiment of present invention.
Figure 9B:
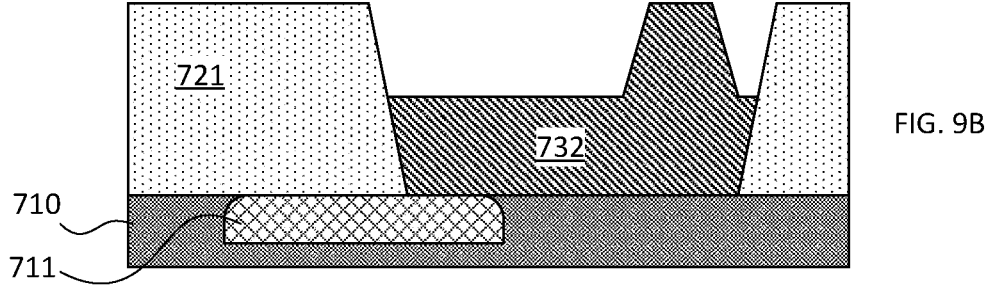
Figure 9C:
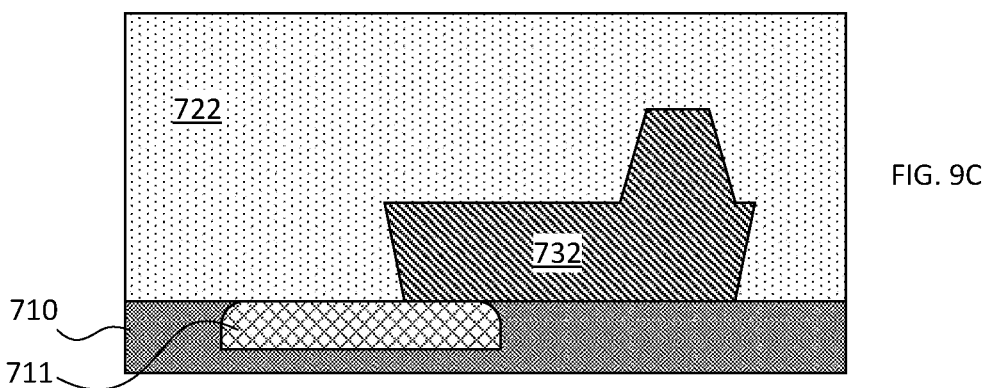
Figure 9D:
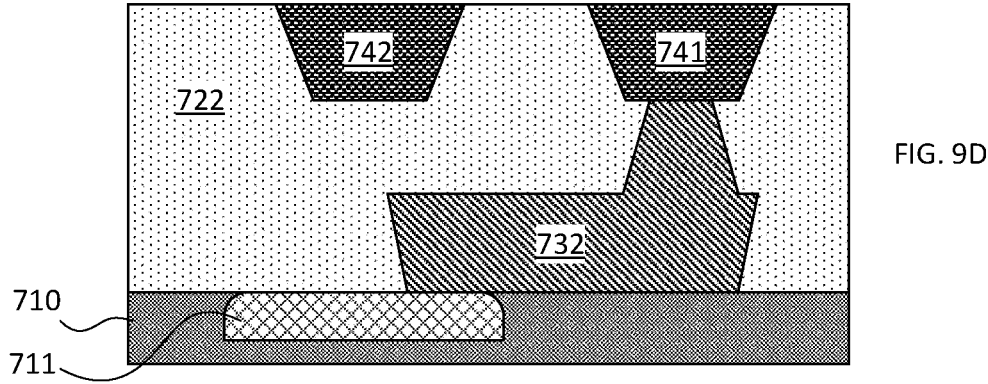

The device layer 710 includes at least one source/drain region 711 of a transistor and embodiments of present invention provide forming a backside local interconnect in contact with the source/drain region 711. More specifically, as is illustrated in FIG. 9A, embodiments of present invention provide forming a dielectric layer 721 on top of the device layer 710; creating an opening in a damascene etching process in the dielectric layer 721 that exposes at least a portion of the source/drain region 711; and filling the opening with a conductive material to form a conductive structure 731. The conductive structure 731 generally has a trapezoidal shape (cross-section-wise) with a narrow top base and a wide bottom base (note that the drawing is illustrated flipped upside-down). As is illustrated in FIG. 9B, embodiments of present invention provide performing a subtractive patterning process. The subtractive patterning process transforms the conductive structure 731 into a BLI 732 that has a first portion at the bottom and a second portion at the top. In other words, the subtractive patterning process etches a top portion of the conductive structure 731 into the second portion of the BLI 732. As being described above, the first portion of the BLI 732 may have a trapezoidal shape (cross-section-wise) that has a narrow top base and a wide bottom base. The second portion of the BLI 732 may have a trapezoidal shape (cross-section-wise) as well but with a wide top base and a narrow bottom base. Following the formation of the BLI 732, as is illustrated in FIG. 9C, dielectric material may be deposited on top of the BLI 732 to form a dielectric layer 722 and subsequently, as is illustrated in FIG. 9D, one or more backside metal lines such as BML 741 and BML 742 may be formed in the dielectric layer 722 through, for example, a damascene etching and deposition process.

Figure 10A:
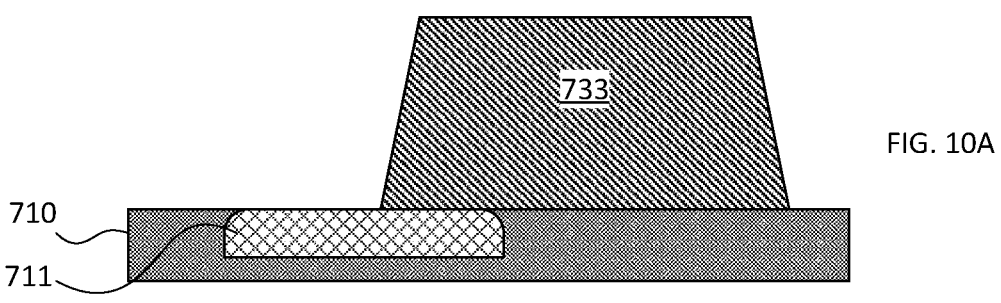
FIGS. 10A-10D are demonstrative illustrations of cross-sectional views of a semiconductor structure at various steps of manufacturing thereof according to another embodiment of present invention.
Figure 10B:
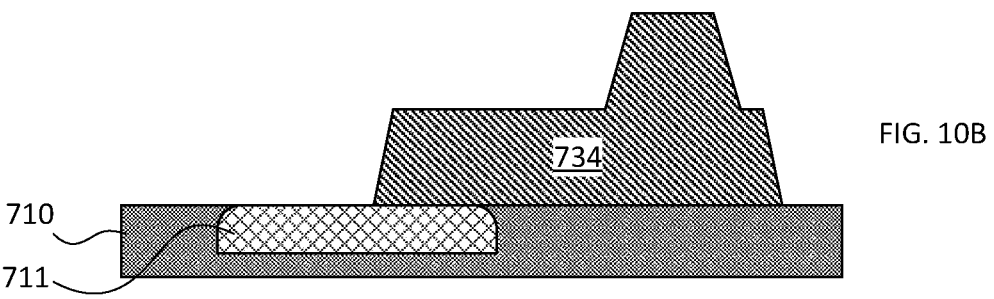
Figure 10C:
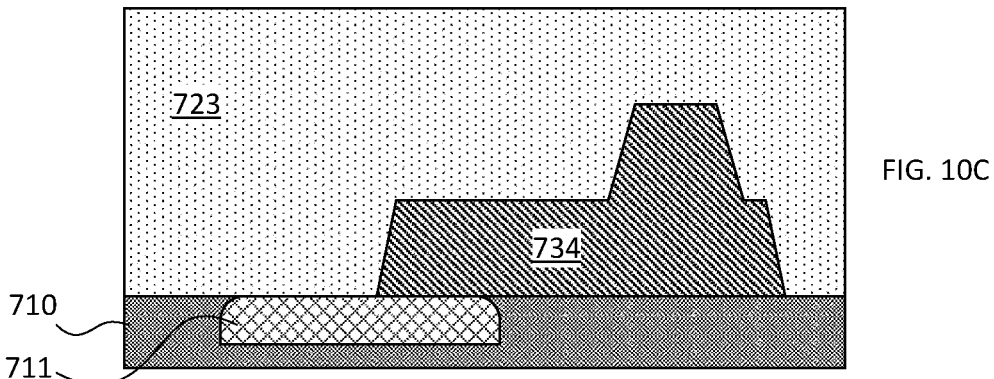
Figure 10D:
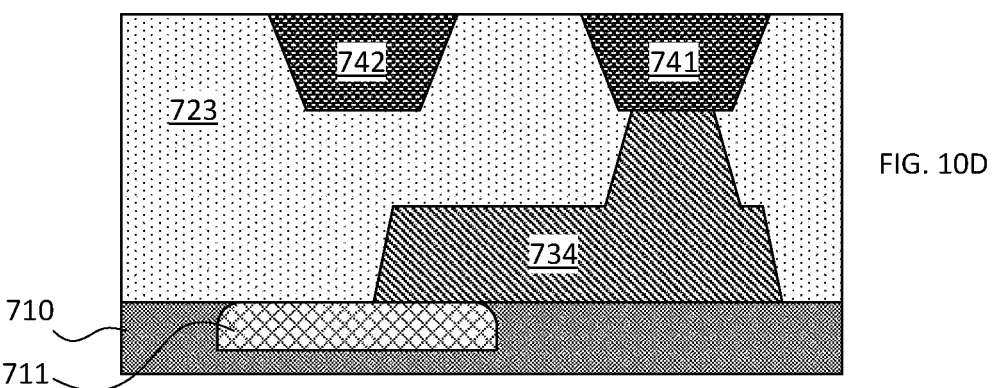

FIGS. 10A-10D are demonstrative illustrations of cross-sectional views of a semiconductor structure at various steps of manufacturing thereof according to another embodiment of present invention. More particularly, instead of using a damascene etching and deposition process to create the conductive structure 731 as illustrated in FIG. 9A, embodiments of present invention provide forming a conductive structure 733 through a subtractive patterning process. As is illustrated in FIG. 10A, the subtractive patterning process first forms a conductive material layer on top of the device layer 710 and subsequently patterns the conductive material layer into a conductive structure 733 in an etching process. The conductive structure 733 may include a bottom portion that represents a first portion of a BLI 734 (see FIG. 10D), and a top portion that is yet to be patterned into a second portion of the BLI 734. Next, as is illustrated in FIG. 10B, embodiments of present invention provide patterning the top portion of the conductive structure 733 into the second portion of the BLI 734 in an etching process. After forming the BLI 734, as is illustrated in FIG. 10C, dielectric material may be deposited on top of the BLI 734 and on top of the device layer 710 to form a dielectric layer 723 and subsequently, as is illustrated in FIG. 10D, one or more backside metal lines such as BML 741 and BML 742 may be formed, for example, in a damascene process to be embedded in the dielectric layer 723. At least one of the BMLs such as BML 741 may be formed to be in contact with the BLI 734.

Figure 11A:
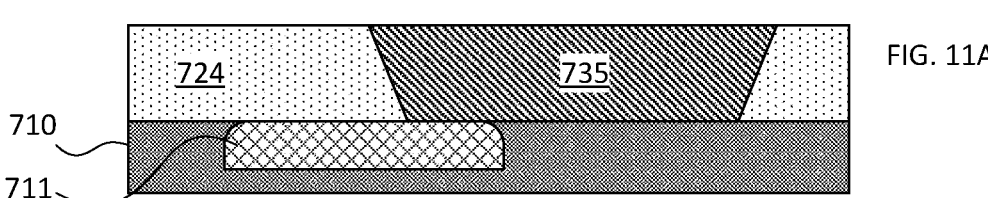
FIGS. 11A-11D are demonstrative illustrations of cross-sectional views of a semiconductor structure at various steps of manufacturing thereof according to yet another embodiment of present invention.
Figure 11B:
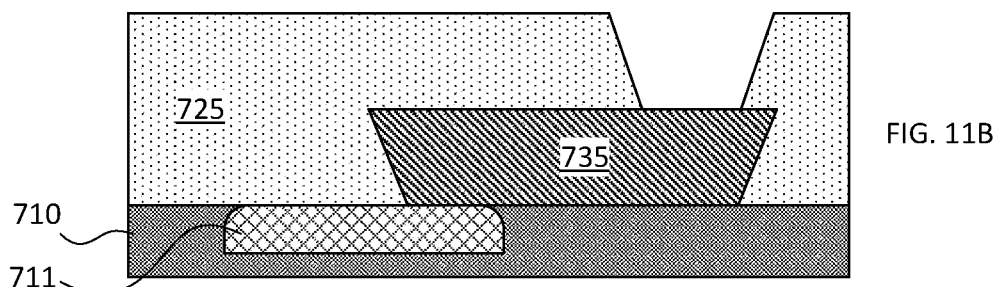
Figure 11C:
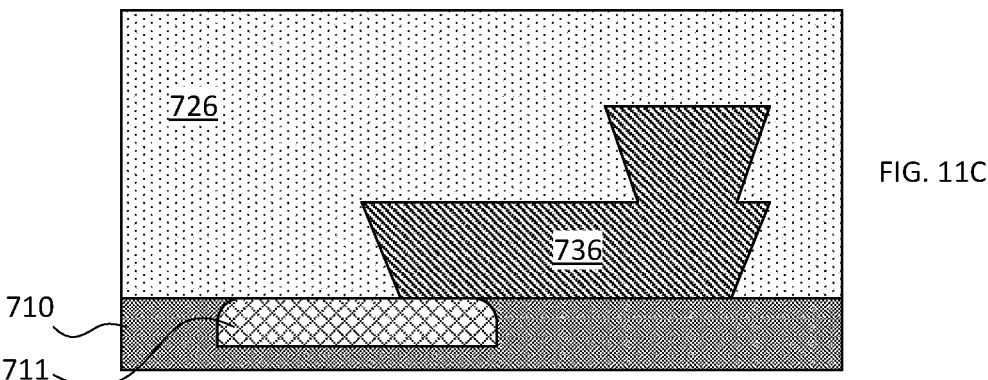
Figure 11D:
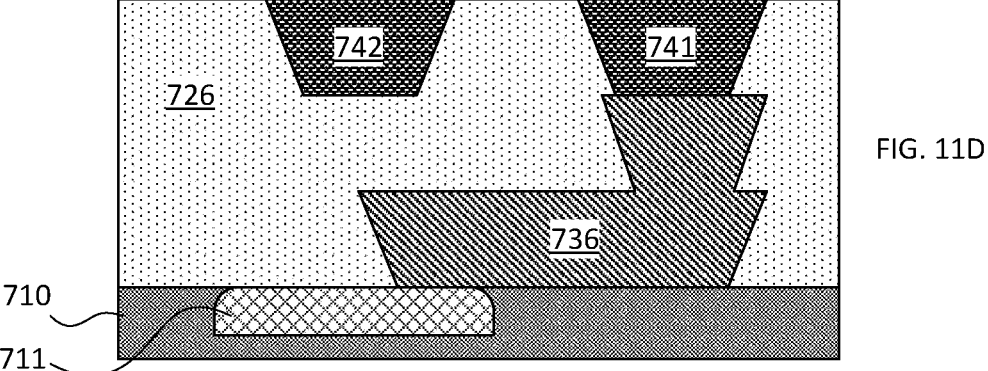

FIGS. 11A-11D are demonstrative illustrations of cross-sectional views of a semiconductor structure at various steps of manufacturing thereof according to yet another embodiment of present invention. More particularly, embodiments of present invention provide applying multiple damascene etching and deposition process to form a BLI 736 (see FIG. 11D). For example, as is illustrated in FIG. 11A, a dielectric layer 724 may first be formed on top of the device layer 710. An opening may be created in the dielectric layer 724, for example through an etching process, and a conductive material may be deposited in the opening to form a first portion 735 of the BLI 736. Next, dielectric material may be deposited on top of the first portion 735 to form a dielectric layer 725. An opening may then be created in the dielectric layer 725 to expose a portion of the first portion 735 of the BLI 736 as is illustrated in FIG. 11B. Subsequently, a conductive material, same or different from the conductive material used in forming the first portion 735, may be deposited in the opening to form a second portion of the BLI 736 thereby forming the BLI 736. After forming the BLI 736, additional dielectric material may be deposited on top of the BLI 736 to form a dielectric layer 726, as is illustrated in FIG. 11C. One or more backside metal lines such as BML 741 and BML 742 may subsequently be formed in the dielectric layer 726 in, for example, a damascene etching and deposition process. At least one of the BMLs such as BML 741 may be formed to be in contact with the BLI 736, that is, in contact with the second portion of the BLI 736.

FIG. 12 is a demonstrative illustration of a flow-chart of a method of manufacturing a semiconductor structure according to embodiments of present invention. The method includes (901) forming a device layer, and a MOL structure and a BEOL structure on a frontside of the device layer, where the device layer includes at least one source/drain region of one or more transistors at a backside of the device layer; (902) flipping the device layer and forming a conductive structure on top of the backside of the device layer, where the conductive structure includes a bottom portion that represent a first portion of a backside local interconnect; (903) patterning a top portion of the conductive structure to form a second portion of the backside local interconnect, with the second portion of the backside local interconnect connects to the first portion of the backside local interconnect; (904) depositing a dielectric layer on top of the backside local interconnect and on top of the device layer; (905) creating one or more openings in the dielectric layer with at least one of the one or more openings exposes the second portion of the backside local interconnect; and (906) depositing a conductive material in the one or more openings to form one or more backside metal lines, thereby forming at least one backside metal line that is in contact with the second portion of the backside local interconnect.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions above have been presented for the purposes of illustration of various embodiments of present invention and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A semiconductor structure comprising:
a device layer having a frontside and a backside, the device layer including a transistor, the transistor including a source/drain region at the backside of the device layer;
a first and a second backside metal line of a backside metal level, the source/drain region of the transistor at least partially overlapping vertically with the first backside metal line and not overlapping vertically with the second backside metal line; and
a backside local interconnect, the backside local interconnect conductively connecting the source/drain region of the transistor with the second backside metal line,
wherein the backside local interconnect includes a first portion and a second portion, the first portion horizontally extending from an area underneath the source/drain region of the transistor to an area outside the source/drain region of the transistor, the second portion vertically connecting the first portion to the second backside metal line.

2. The semiconductor structure of claim 1, wherein the source/drain region of the transistor conductively connects to the first backside metal line through a direct backside contact.

3. The semiconductor structure of claim 1, wherein the transistor is a first transistor, further comprising a second transistor, the second transistor having a source/drain region at the backside of the device layer, wherein the first portion of the backside local interconnect conductively connects the source/drain region of the second transistor with the source/drain region of the first transistor.

4. The semiconductor structure of claim 3, wherein the second backside metal line is located vertically between the first transistor and the second transistor.

5. The semiconductor structure of claim 1, further comprising a third backside metal line of the backside metal level, the third backside metal line being next to the second backside metal line, wherein the backside local interconnect further comprises a third portion, the third portion conductively connecting the first portion of the backside local interconnect with the third backside metal line.

6. The semiconductor structure of claim 1, further comprising a third backside metal line of the backside metal level, the third backside metal line being next to the first backside metal line, wherein the backside local interconnect further comprises a third portion, the third portion conductively connecting the first portion of the backside local interconnect with the third backside metal line.

7. The semiconductor structure of claim 1, wherein the first portion of the backside local interconnect is conductively connected to the source/drain region of the transistor through a conductive via but does not directly contact the source/drain region of the transistor.

8. The semiconductor structure of claim 1, wherein a first cross-section of the first portion of the backside local interconnect has a first trapezoidal shape with a top base that is narrow than a bottom base, and a second cross-section of the second portion of the backside local interconnect has a second trapezoidal shape with a top base that is wide than a bottom base, wherein the first and the second cross-section being taken in a direction orthogonal to the first and the second backside metal line.

9. The semiconductor structure of claim 1, wherein the source/drain region of the transistor has a width and the backside metal level has a pitch, wherein the width is smaller than the pitch.

10. A semiconductor structure comprising:
a device layer having a frontside and a backside, the device layer including a first and a second transistor, the first transistor including a first source/drain region at the backside of the device layer, the second transistor including a second source/drain region at the backside of the device layer;
a first, a second, and a third backside metal line of a backside metal level, the first source/drain region of the first transistor at least partially overlapping vertically with the first backside metal line and does not overlapping vertically with the second backside metal line; and
a backside local interconnect, the backside local interconnect conductively connecting the first source/drain region of the first transistor with the second backside metal line,
wherein the backside local interconnect includes a first portion and a second portion, the first portion horizontally extending from an area underneath the first source/drain region of the first transistor to an area outside the first source/drain region of the first transistor, and the second portion vertically connecting the first portion to the second backside metal line.

11. The semiconductor structure of claim 10, wherein the first source/drain region of the first transistor conductively connects to the first backside metal line through a first direct backside contact.

12. The semiconductor structure of claim 10, wherein the first portion of the backside local interconnect conductively connects the second source/drain region of the second transistor with the first source/drain region of the first transistor.

13. The semiconductor structure of claim 12, wherein the second backside metal line is vertically between the first transistor and the second transistor.

14. The semiconductor structure of claim 10, wherein the backside local interconnect further comprises a third portion, the third portion conductively connecting the first portion of the backside local interconnect with the third backside metal line.

15. The semiconductor structure of claim 10, further comprising a third transistor and a fourth transistor, wherein the third transistor is vertically stacked on top of the first transistor and the fourth transistor is vertically stacked on top of the second transistor.

16. The semiconductor structure of claim 10, further comprising a middle-of-line (MOL) structure on top of the frontside of the device layer, and a back-end-of-line (BEOL) structure on top of the MOL structure.

17. A method of forming a semiconductor structure comprising:
forming a device layer on top of a substrate, the device layer having a frontside and a backside and including at least one transistor, the at least one transistor including a source/drain region at the backside of the device layer;
flipping the substrate upside-down;
exposing the backside of the device layer;
forming a backside local interconnect by forming a conductive structure on top of the backside of the device layer, wherein the conductive structure includes a first portion of the backside local interconnect and a raw portion on top of the first portion, the first portion being conductively connected to the source/drain region of the at least one transistor;

etching the raw portion of the conductive structure to form a second portion of the backside local interconnect; and forming one or more backside metal lines, one of the one or more backside metal lines being in contact with the second portion of the backside local interconnect.

18. The method of claim 17, wherein forming the conductive structure comprises:

depositing a dielectric layer on top of the backside of the device layer;

creating an opening in the dielectric layer, the opening exposing at least a portion of the source/drain region and an area next to the exposed portion of the source/drain region of the at least one transistor; and filling the opening with a conductive material to form the conductive structure.

19. The method of claim 17, wherein forming the conductive layer comprises:

depositing a layer of conductive material on top of the backside of the device layer; and etching the layer of conductive material to form the conductive structure in a subtractive patterning process.

\* \* \* \* \*